(12) United States Patent
Chen

(10) Patent No.: US 8,421,091 B2
(45) Date of Patent: Apr. 16, 2013

(54) LIGHT-EMITTING DEVICE

(75) Inventor: Yen-Chih Chen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/315,755

(22) Filed: Dec. 9, 2011

(65) Prior Publication Data

US 2012/0147605 A1  Jun. 14, 2012

(30) Foreign Application Priority Data

Dec. 10, 2010  (TW) .............................. 99143426 A

(51) Int. Cl.
*F21S 6/00* (2006.01)
*F21V 21/00* (2006.01)
*H01L 33/02* (2010.01)

(52) U.S. Cl.
USPC .......................................... 257/79

(58) Field of Classification Search ............ 257/14, 257/79–103, 918, E51.018–E51.022, E33.001–E33.077, 257/E25.028, E25.032, E29.069–E29.071, 257/E29.245, E49.001–E49.004, 40, 116, 257/117, 432–437, 21, 53; 438/22–47, 749, 438/69, 493, 503, 507, 956; 362/257, 398, 362/612
See application file for complete search history.

(56) References Cited

U.S. PATENT DOCUMENTS

| | | | |
|---|---|---|---|
| 2005/0018725 A1* | 1/2005 | Nurmikko | 372/37 |
| 2009/0011284 A1* | 1/2009 | Wang et al. | 428/847.2 |

* cited by examiner

*Primary Examiner* — Dao H Nguyen
*Assistant Examiner* — Tram H Nguyen
(74) *Attorney, Agent, or Firm* — Ditthavong Mori & Steiner, P.C.

(57) ABSTRACT

Disclosed is a light-emitting element comprises a substrate; a light-emitting stack layer disposed on the substrate; wherein the light-emitting stack layer comprises a first semiconductor layer, a first active layer disposed on the first semiconductor layer, a magnetic film layer disposed on the first active layer, a second active layer disposed on the magnetic film layer, and a second semiconductor layer disposed on the second active layer.

11 Claims, 2 Drawing Sheets

LIGHT-EMITTING DEVICE

TECHNICAL FIELD

The application relates to an optoelectric device, and in particular to a light-emitting device comprising a magnetic film.

DESCRIPTION OF BACKGROUND ART

A light-emitting diode (LED) is a solid state semiconductor device which comprises at least one p-n junction formed between the p-type and n-type semiconductor layers. When a forward voltage is applied to the p-n junction, the electrons from the n-type semiconductor layer and the holes from the p-type semiconductor layer are combined to emit the light. The region where the light is emitted is generally named a light-emitting region.

The main features of the LED comprise the small size, the high luminous efficiency, the long life, the fast response, the high reliability, and the good quality in color performance. An LED is widely used in electrical equipments, automobiles, commercial signs, and traffic signals. With the advent of the full-color LED, the LED gradually replaces the traditional lighting such as fluorescent and incandescent bulbs.

With the substrate of the LED being soldered or glued to a submount, the LED can be further connected to the submount to form a light-emitting device. In addition, the submount may comprise at least one circuit, which is electrically coupled to electrodes of the LED through a conductive structure such as a metal wire.

SUMMARY OF THE DISCLOSURE

Disclosed is a light-emitting element comprises a substrate; a light-emitting stack layer disposed on the substrate; wherein the light-emitting stack layer comprises a first semiconductor layer, a first active layer disposed on the first semiconductor layer, a magnetic film layer disposed on the first active layer, a second active layer disposed on the magnetic film layer, and a second semiconductor layer disposed on the second active layer.

DETAILED DESCRIPTION OF PREFERRED EMBODIMENTS

The embodiments of the present application are described in detail and shown in the figures, and the same or similar parts are denoted with the same number in the figures and the description.

Figure 1:
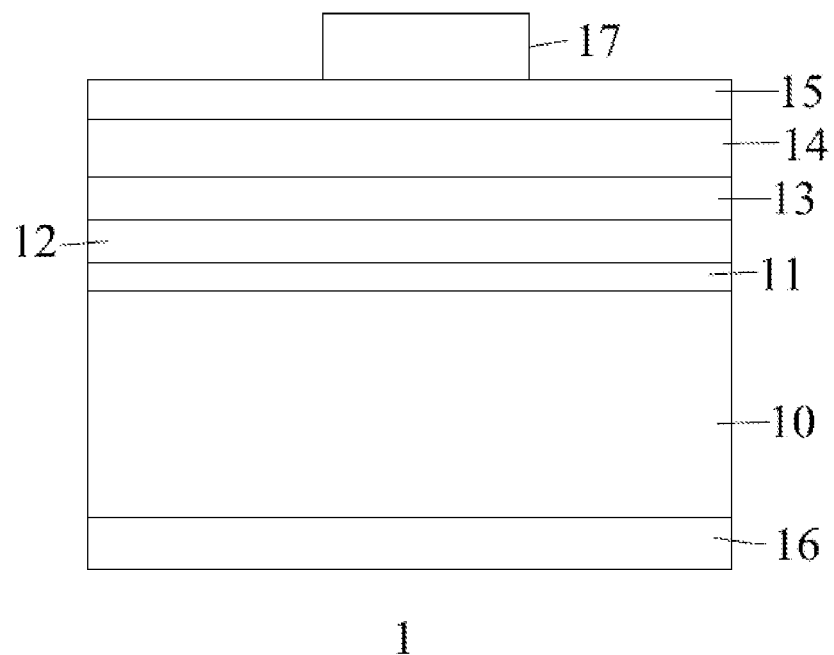
FIG. 1 illustrates a cross sectional view of the light-emitting device in accordance with the first embodiment of the present application.

As shown in FIG. 1, the light-emitting device 1 in accordance with the first embodiment comprises a substrate 10 and a light-emitting stack formed on the substrate 10, wherein the light-emitting stack may comprise a first semiconductor layer 11, a first active layer 12 disposed on the first semiconductor layer 11, a magnetic film layer 13 disposed on the first active layer 12, a second active layer 14 disposed on the magnetic film layer 13, and a second semiconductor layer 15 disposed on the second active layer 14. The second semiconductor layer 15 may be a p-type semiconductor layer or an n-type semiconductor layer, and the second semiconductor layer 15 comprises a different conductivity type from that of the first semiconductor layer 11. The light-emitting device 1 further comprises a first electrode 16 formed under the substrate 10, and a second electrode 17 formed on the second semiconductor layer 15.

The substrate 10 is used to grow and/or support the light-emitting stack. The material of the substrate may be a transparent or insulating material such as sapphire, diamond, glass, quartz, zinc oxide (ZnO), or aluminum nitride (AlN). The material of the substrate may be a high heat conductive or reflective material such as copper (Cu), aluminum (Al), molybdenum (Mo), copper-tin (Cu—Sn), copper-zinc (Cu—Zn), copper-cadmium (Cu—Cd), nickel-tin (Ni—Sn), nickel-cobalt (Ni—Co), gold alloy (Au alloy), diamond like carbon (DLC), graphite, silicon carbide (SiC), carbon fiber, silicon (Si), iodine phosphide (IP), zinc selenide (ZnSe), gallium arsenide (GaAs), gallium phosphide (GaP), gallium nitride (GaN), gallium arsenide phosphide (GaAsP), indium phosphide (InP), lithium gallate ($LiGaO_2$), or lithium aluminate ($LiAlO_2$), wherein materials that can be used to grow the light-emitting stack are sapphire, gallium arsenide (GaAs), silicon carbide (SiC), and gallium nitride (GaN).

The first semiconductor layer 11, the first active layer 12, the second active layer 14, and the second semiconductor layer 15 are for light emitting, and the materials thereof comprise more than one element selected from the group consisting of gallium (Ga), aluminum (Al), indium (In), phosphorus (P), nitrogen (N), zinc (Zn), cadmium (Cd), and selenium (Se). The material of the magnetic film layer 13 comprises the magnetic material such as ferrocene ($Fe(C_5H_5)_2$, also known as bis-cyclopentadienyl iron(II)). The magnetic film layer 13 generates a magnetic field, and a Lorentz force is generated due to the interaction of the moving positive and negative carriers in the first active layer 12 and the second active layer 14 with the magnetic field. The Lorentz force affects the moving positive and negative carriers, and drives them to move along a spiral-like track. This increases the combination rate of the positive and negative carriers in the first active layer 12 and the second active layer 14, and the luminous efficiency is improved. The magnetic film layer 13 may be grown by a metal organic chemical vapor deposition (MOCVD) machine, and the growth temperature is lower than 1000° C., and preferably between 700° C.~900° C. The ammonia gas and the nitrogen gas are introduced into the reaction chamber during the epitaxial growth process, and the pressure of the reaction chamber is lower than 500 torr, preferably in a range between 100~300 torr. The thickness of the magnetic film layer 13 is less than 0.1 µm, and preferably less than 0.02 µm. The thickness of the magnetic film layer 13 is adjustable based on the structure of the device. In addition to ferrocene ($Fe(C_5H_5)_2$), the material of the magnetic film layer 13 may be cobaltocene ($Co(C_5H_5)_2$, also known as bis-cyclopentadienyl cobalt), nickelocene ($Ni(C_5H_5)_2$, also known as bis-cyclopentadienyl nickel), or chromocene ($Cr(C_5H_5)_2$, also known as bis-cyclopentadienyl chromium).

The first electrode 16 and the second electrode 17 are for receiving an external voltage, and the materials thereof are transparent conductive material or a metal material. The transparent conductive material comprises indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), zinc oxide (ZnO), aluminum gallium arsenic (AlGaAs), gallium nitride (GaN), gallium phosphide (GaP), gallium arsenide (GaAs), or gallium arsenide phosphide (GaAsP). The metal material comprises copper (Cu), aluminum (Al), indium (In), tin (Sn), gold (Au), platinum (Pt), zinc (Zn), silver (Ag), titanium (Ti), lead (Pb), palladium (Pd), germanium (Ge), nickel (Ni), chromium (Cr), cadmium (Cd), cobalt (Co), manganese (Mn), antimony (Sb), bismuth (Bi), gallium (Ga), thallium (Tl), polonium (Po), iridium (Ir), rhenium (Re), rhodium (Rh), osmium (Os), tungsten (W), lithium (Li), sodium (Na), potassium (K), beryllium (Be), magnesium (Mg), calcium (Ca), strontium (Sr), barium (Ba), zirconium (Zr), molybdenum (Mo), lanthanum (La), copper-tin (Cu—Sn), copper-zinc (Cu—Zn), copper-cadmium (Cu—Cd), tin-lead-antimony (Sn—Pb—Sb), tin-lead-zinc (Sn—Pb—Zn), nickel-tin (Ni—Sn), nickel-cobalt (Ni—Co), indium-silver (In—Ag), indium-gold (In—Au), gold-beryllium (Au—Be), gold-germanium (Au—Ge), gold-zinc (Au—Zn), lead-tin (Pb—Sn), palladium-indium (Pd—In), and gold-tin (Au—Sn).

Figure 2:
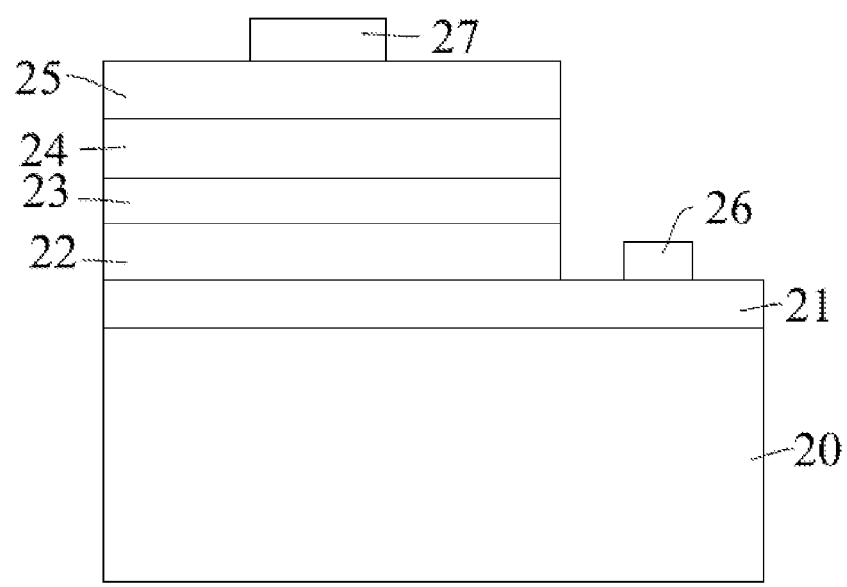
FIG. 2 illustrates a cross sectional view of the light-emitting device in accordance with the second embodiment of the present application.

As shown in FIG. 2, the light-emitting device 2 in accordance with the second embodiment comprises a substrate 20 and a light-emitting stack formed on the substrate 20, wherein the light-emitting stack may comprise a first semiconductor layer 21, a first active layer 22 disposed on the first semiconductor layer 21, a magnetic film layer 23 disposed on the first active layer 22, a second active layer 24 disposed on the magnetic film layer 23, and a second semiconductor layer 25 disposed on the second active layer 24, wherein part of the light-emitting stack is removed to expose part of the first semiconductor layer 21. The second semiconductor layer 25 may be a p-type semiconductor layer or an n-type semiconductor layer, and the second semiconductor layer 25 comprises a different conductivity type from that of the first semiconductor layer 21. The light-emitting device 2 further comprises a first electrode 26 formed on the first semiconductor layer 21, and a second electrode 27 formed on the second semiconductor layer 25.

Figure 3:
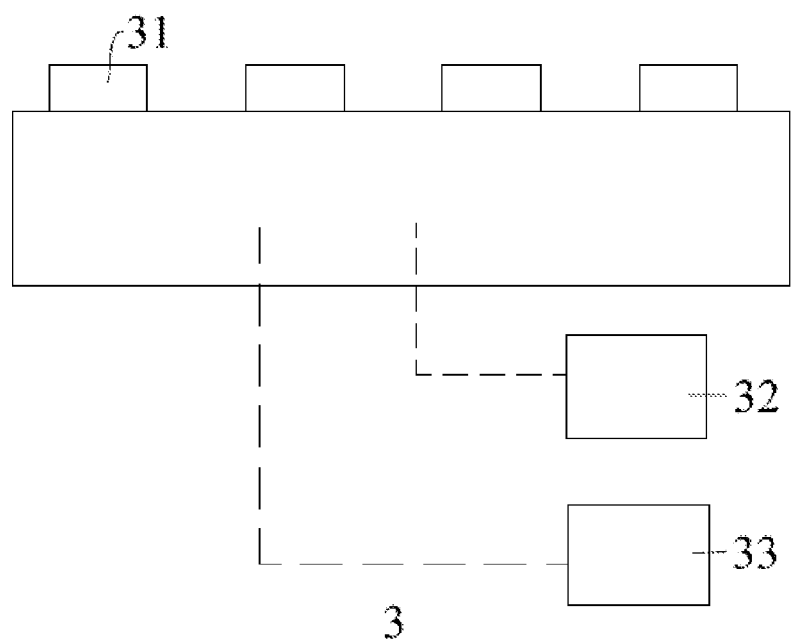
FIG. 3 illustrates a schematic diagram of a light generation apparatus comprising the light-emitting device in accordance with embodiments of the present application.

FIG. 3 shows a schematic diagram of a light generation apparatus. The light generation apparatus 3 comprises the light-emitting device in any one of the embodiments of the present application, or an array formed by the light-emitting devices in any one of the embodiments of the present application. The light generation apparatus 3 may be a lighting system such as street lamps, lights for automobiles, or indoor lighting. The light generation apparatus 3 may also be traffic signals or backlights for a flat panel display. The light generation apparatus 3 comprises a light source 31 comprising the aforementioned light-emitting device or an array formed thereby, a power supply system 32 to supply a current to the light source 31, and a control unit 33 to control the power supply system 32.

Figure 4:
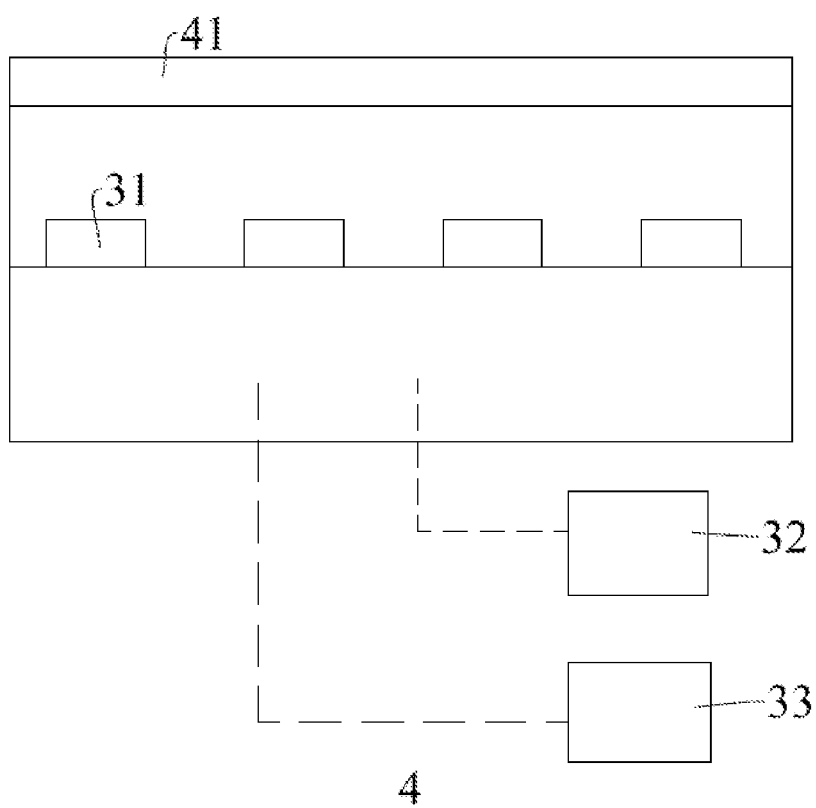
FIG. 4 illustrates a schematic diagram of a cross sectional view of a backlight module comprising the light-emitting device in accordance with embodiments of the present application.

FIG. 4 shows a schematic diagram of a cross sectional view of a backlight module. The backlight module 4 comprises the light generation apparatus 3 described in the previous embodiment and an optical element 41. The optical element 41 can process the light from the light generation apparatus 3, and the processed light is applied to a flat panel display. To process is, for example, to scatter the light from the light generation apparatus 3.

The foregoing description has been directed to the specific embodiments of this application, and is only for illustrate the principle and performance of the application. It will be apparent; however, that other alternatives and modifications may be made to the embodiments without escaping the spirit and scope of the application.

What is claimed is:

1. A light-emitting device comprising:
   a substrate; and
   a light-emitting stack comprising:
      a first active layer disposed above the substrate;
      a second active layer disposed above the first active layer; and
      a magnetic film layer disposed between the first active layer and the second active layer.

2. The light-emitting device as claimed in claim 1, wherein the light-emitting stack further comprises:
   a first semiconductor layer disposed between the substrate and the first active layer; and
   a second semiconductor layer disposed on the second active layer.

3. A light-emitting device comprising:
   a substrate; and
   a light-emitting stack disposed on the substrate, wherein the light-emitting stack comprises:
      a first active layer disposed above the substrate;
      a second active layer disposed above the first active layer; and
      a magnetic film layer disposed between the first active layer and the second active layer.

4. The light-emitting device as claimed in claim 3, wherein the light-emitting stack further comprises:
   a first semiconductor layer disposed between the substrate and the first active layer; and
   a second semiconductor layer disposed on the second active layer.

5. The light-emitting device as claimed in claim 3, wherein the substrate comprises sapphire, diamond, glass, quartz, zinc oxide (ZnO), and aluminum nitride (AlN).

6. The light-emitting device as claimed in claim 3, wherein the substrate comprises copper (Cu), aluminum (Al), molybdenum (Mo), copper-tin (Cu—Sn), copper-zinc (Cu—Zn), copper-cadmium (Cu—Cd), nickel-tin (Ni—Sn), nickel-cobalt (Ni—Co), gold alloy (Au alloy), diamond like carbon (DLC), graphite, silicon carbide (SiC), carbon fiber, silicon (Si), iodine phosphide (IP), zinc selenide (ZnSe), gallium arsenide (GaAs), gallium phosphide (GaP), gallium nitride (GaN), gallium arsenide phosphide (GaAsP), indium phosphide (InP), lithium gallate ($LiGaO_2$), and lithium aluminate ($LiAlO_2$).

7. The light-emitting device as claimed in claim 3, wherein the magnetic film layer comprises ferrocene ($Fe(C_5H_5)_2$), cobaltocene ($Co(C_5H_5)_2$), nickelocene ($Ni(C_5H_5)_2$), and chromocene ($Cr(C_5H_5)_2$).

8. The light-emitting device as claimed in claim 3, wherein the first active layer or the second active layer comprises more than one element selected from the group consisting of gallium (Ga), aluminum (Al), indium (In), phosphorus (P), nitrogen (N), zinc (Zn), cadmium (Cd), and selenium (Se).

9. A light generation apparatus comprising:
   at least one light source which comprises at least one light-emitting device;
   a power supply system to supply a current to the at least one light source; and
   a control unit to control the power supply system;
   wherein the light-emitting device comprises:
      a substrate; and a light-emitting stack disposed on the substrate, wherein the light-emitting stack comprises:
  a first active layer disposed above the substrate;
  a second active layer disposed above the first active layer; and
  a magnetic film layer disposed between the first active layer and the second active layer.

10. The light generation apparatus as claimed in claim 9, further comprising an optical element to scatter the light from the at least one light source.

11. The light generation apparatus as claimed in claim 9, wherein the magnetic film layer comprises ferrocene (Fe$(C_5H_5)_2$), cobaltocene (Co$(C_5H_5)_2$), nickelocene (Ni$(C_5H_5)_2$), and chromocene (Cr$(C_5H_5)_2$).

* * * * *